United States Patent
Miura et al.

(10) Patent No.: US 7,732,807 B2
(45) Date of Patent: Jun. 8, 2010

(54) INTEGRATED CIRCUIT

(75) Inventors: Akira Miura, Musashino (JP); Shinji Kobayashi, Musashino (JP); Hitoshi Hara, Musashino (JP); Tsuyoshi Yakihara, Musashino (JP); Sadaharu Oka, Musashino (JP)

(73) Assignee: Yokogawa Electric Corporation, Musashino-shi (JP)

( * ) Notice: Subject to any disclaimer, the term of this patent is extended or adjusted under 35 U.S.C. 154(b) by 1023 days.

(21) Appl. No.: 10/767,167

(22) Filed: Jan. 30, 2004

(65) Prior Publication Data

US 2004/0196674 A1 Oct. 7, 2004

(30) Foreign Application Priority Data

Mar. 25, 2003 (JP) ............................. 2003-081903

(51) Int. Cl.
*H01L 31/00* (2006.01)
(52) U.S. Cl. ................ 257/26; 257/23; 257/E29.07; 257/E29.168
(58) Field of Classification Search ............. 257/26, 257/29, E29.168, E21.395, 23, E29.07
See application file for complete search history.

(56) References Cited

U.S. PATENT DOCUMENTS

| 3,636,399 | A | * | 1/1972 | Eastman et al. | ......... | 313/346 R |
| 4,991,920 | A | * | 2/1991 | Peczalski | ..................... | 385/14 |
| 5,003,360 | A | * | 3/1991 | Okada et al. | ................ | 257/270 |
| 5,157,467 | A | * | 10/1992 | Fujii | .......................... | 257/24 |
| 5,247,223 | A | * | 9/1993 | Mori et al. | .................. | 313/308 |
| 5,629,580 | A | * | 5/1997 | Mandelman et al. | ........ | 313/310 |
| 5,838,870 | A | * | 11/1998 | Soref | ......................... | 385/131 |

(Continued)

FOREIGN PATENT DOCUMENTS

JP 1-129477 A 5/1989

(Continued)

OTHER PUBLICATIONS

IBM Technical Journal "Field emission triode Integrated Circuit Construction Method," NB8910242 Oct. 1, 1989.*

(Continued)

*Primary Examiner*—Davienne Monbleau
*Assistant Examiner*—Matthew Reames
(74) *Attorney, Agent, or Firm*—Westerman, Hattori, Daniels & Adrian, LLP

(57) ABSTRACT

A fine vacuum tube element and other electronic elements are integrated and formed on a semiconductor substrate, and the fine vacuum tube element and the other electronic elements transmit signals to and from each other. When integrating the vacuum tube element with the other electronic elements, a quantum effect is realized in a room temperature environment by utilizing ballistic electrons (non-scattering electrons) traveling through the vacuum, and in the integrated circuit, an A/D converter is constructed by an interference system such as a Mach-Zehnder interferometer. Also an integrated circuit of an advanced function-integrated type is provided, comprising an interference system such as a Mach-Zehnder interferometer wherein weighting of the Mach-Zehnder interferometer is constituted for image processing and signal code conversion. A very high-speed light-receiving integrated circuit for optical communication is constructed by utilizing a very high-speed optical response characteristic of electron emission of the vacuum element, and a sensor such as a magnetic/electric field sensor is constructed by utilizing a quantum effect of ballistically traveling electrons.

16 Claims, 8 Drawing Sheets

U.S. PATENT DOCUMENTS

| | | | | |
|---|---|---|---|---|
| 5,981,297 A | * | 11/1999 | Baselt | 436/514 |
| 6,410,941 B1 | * | 6/2002 | Taylor et al. | 257/84 |
| 2001/0019238 A1 | * | 9/2001 | Dai et al. | 313/309 |

FOREIGN PATENT DOCUMENTS

| | | |
|---|---|---|
| JP | 4-115441 A | 4/1992 |
| JP | 6-232418 A | 8/1994 |
| JP | 7-193052 | 7/1995 |
| JP | 7-231257 A | 8/1995 |
| JP | 2000-502492 | 2/2000 |
| JP | 2000-133179 A | 5/2000 |
| JP | 2001-147408 A | 5/2001 |
| WO | WO 97/23002 | 6/1997 |

OTHER PUBLICATIONS

Office Action dated Jun. 3, 2008 issued in corresponding Japanese Application No. 2003-81903.

* cited by examiner

9 SPLITTING UNIT (SLIT)
MAGNETIC FIELD
13 OP AMPLIFIER
8 ANODE
7 CATHODE

OP AMPLIFIER OUTPUT
MAGNETIC FIELD

7 CATHODE   14 ELECTRODE
13 OP AMPLIFIER
15 LENS

OP AMPLIFIER OUTPUT
MAGNETIC FIELD

INTEGRATED CIRCUIT

BACKGROUND OF THE INVENTION

1. Field of the Invention

This invention relates to an integrated circuit and particularly to an integrated circuit that realizes higher speed, more advanced functions and reduction in the number of elements.

2. Description of the Related Art

The Si semiconductor integration technique has achieved satisfactory improvement in the degree of integration and speed from 2 µm to 1 µm, 0.5 µm, 0.25 µm, 0.13 µm and 0.09 µm. Moreover, some semiconductor manufacturers plan to achieve 0.065 µm. Also the exposure technique has progressed from g-line to i-line exposure to phase shift exposure and further to an excimer light source. Currently, an excimer light source plus phase shift exposure is employed.

A concave mirror technique that enables construction of a miniature optical system, which was difficult to realize in the X-ray contraction projection technique, is being completed, and realization of an X-ray stepper/X-ray scanning exposure system that achieves the order of 0.01 µm can be expected. The semiconductor processing technique is now reaching the level of 10 nm.

Semiconductor circuit elements have been miniaturized in accordance with the K-factor (scaling factor) rule. The technique that led the miniaturization overcame engineering problems and dimensions (processing accuracy, processing method, establishment of techniques for eliminating various contaminant defects control of chemical reactions and the like) rather than problems of physical principles (semiconductor operation principle and the like), and did not need change of physical concepts themselves (scaling rule, semiconductor band theory, transistor operation principle and the like).

FIG. 1 is a structural block diagram showing an example of a conventional high-speed A/D converter (flash-type) formed on one chip. In FIG. 1, a voltage inputted to a ladder resistor (series resistor network) 30 is inputted to an encoder 32 via a comparator 31, then converted to a digital signal and outputted. 33 represents a reference power source for the comparator 31.

In such a high-speed A/D converter, 2n-1 units of comparators and resistors are necessary for A/D conversion of N bits. That is, an extremely large number of elements are required.

However, as the progress of the X-ray exposure technique and the electron beam exposure technique has enabled ultrafine processing of 0.065 µm or less, the influence of a tunnel effect, which is a physical phenomenon, causes increase in leakage current, injection of hot electrons, avalanche breakdown and the like occur in a MOS oxide film, which is a conventionally used insulating material. Therefore, the conventional scaling factor cannot suffice and a problem arises that the operation becomes unstable in an LSI.

Although a one-electron transistor or the like is proposed as an ultimate element, it requires a cryogenic environment and its one-electron quantum effect makes the operation unstable under the law of quantum-mechanical establishment. In order to actively utilize the quantum effect, introduction of the quantum effect such as resonant tunneling by using a compound such as SiGe—SiC is researched. To aggregate the functions of an LSI, it is necessary to introduce a quantum interference effect and thus realize advanced logical functions. However, there is a problem that it is extremely difficult to generate quantum interference in a solid substance at a room temperature because of the influence of various scattering effects (impurity scattering, phonon scattering and the like).

A prior art of forming a fine vacuum tube on a substrate is disclosed in JP-A-7-193052.

SUMMARY OF THE INVENTION

According to this invention, there is provided an integrated circuit comprising a fine vacuum tube element and other electronic elements integrated and formed on a semiconductor substrate, the fine vacuum tube element and the other electronic elements transmitting signals to and from each other.

When integrating the vacuum tube element with the other electronic elements, a quantum effect is realized in a room temperature environment by utilizing ballistic electrons (non-scattering electrons) traveling through the vacuum, and in the integrated circuit, an A/D converter is constructed by an interference system such as a Mach-Zehnder interferometer.

There is also provided an integrated circuit of an advanced function-integrated type comprising an interference system such as a Mach-Zehnder interferometer wherein weighting of the Mach-Zehnder interference system is constituted for image processing and signal code conversion.

A very high-speed light-receiving integrated circuit for optical communication is constructed by utilizing a very high-speed optical response characteristic of electron emission of the vacuum element, and a sensor such as a magnetic/electric field sensor is constructed by utilizing a quantum effect of ballistically traveling electrons.

DETAILED DESCRIPTION OF THE PREFERRED EMBODIMENT

An embodiment of an integrated circuit according to this invention will now be described with reference to the drawings. Superconducting AD and superconducting ALU (arithmetic logic unit) have already proven that a logical circuit that may be realized by tens of thousands to millions of semiconductor transistors can be realized by several to tens or hundreds of quantum effect-applied elements.

In this invention, a fine vacuum element that can induce a quantum effect in a non-scattering state is integrated in an ordinary semiconductor integrated circuit.

Figure 1:
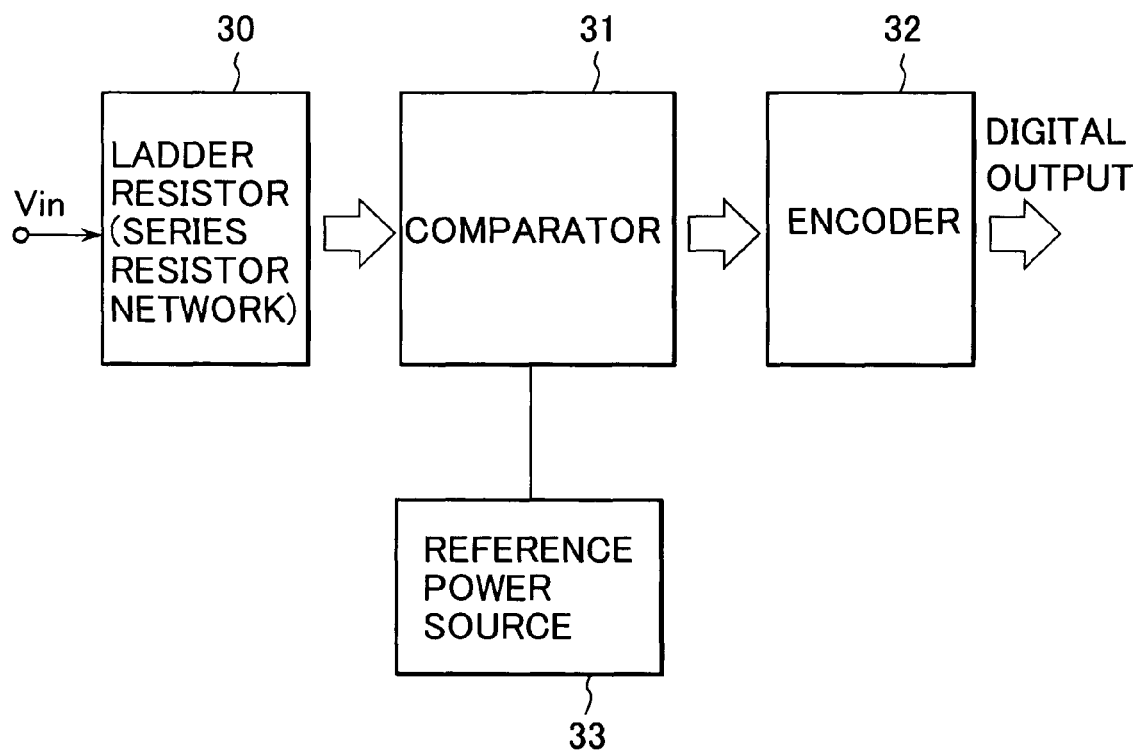
FIG. 1 is a structural block diagram showing a conventional example of a high-speed A/D converter.
Figure 2:
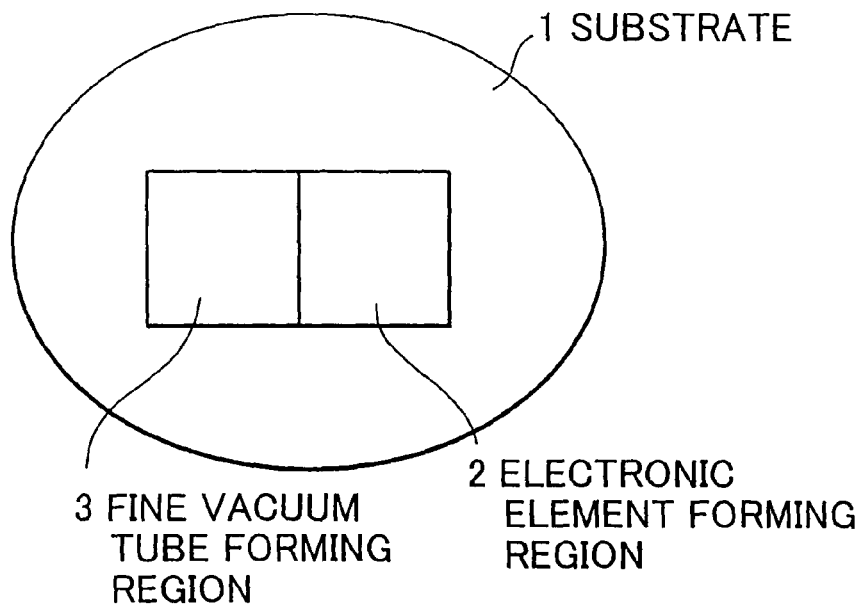
FIG. 2 is a plan view showing a structure of an integrated circuit according to this invention.

FIG. 2 is a plan view showing an example of the embodiment of this invention. In FIG. 2, electronic elements such as CMOS transistors or bipolar transistors are formed in an electronic element forming region 2 on a substrate 1 of Si or InP and the like, and a fine vacuum tube is formed in a fine vacuum tube forming region 3 by a known technique. These elements are organically connected to form an integrated circuit.

Figure 3:
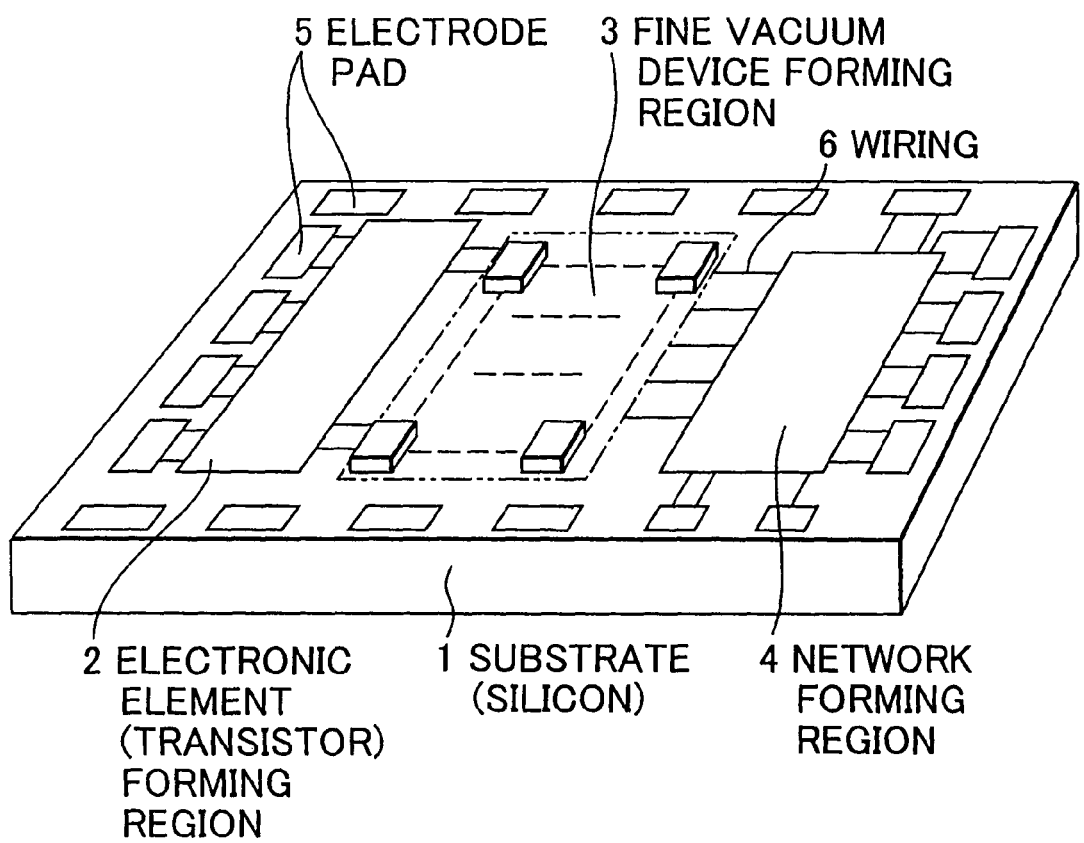
FIG. 3 is a plan view showing another structure of the integrated circuit according to this invention.

FIG. 3 shows layout in the case of forming the fine vacuum tube forming region 3, the electronic element forming region 2 and a network forming region 4 on the substrate (e.g. silicon) 1 and then providing electrode pads 5 and wirings 6 for transmitting and receiving signals.

Figure 4:
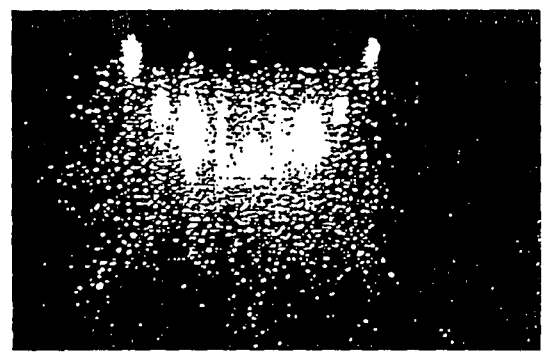
FIG. 4 shows an interference pattern projected on a fluorescent screen by performing diffraction interference using a single-crystal surface.

FIG. 4 shows an interference pattern as a result of performing diffraction interference and projection of thermions emitted from a high-temperature W filament of approximately 1800 k onto a fluorescent screen using a single-crystal surface at a ballistic distance of approximately 1 meter. What is important is that even thermions from the high-temperature filament of 1800 k have a coherence length of 1 meter or more if they are in a non-scattering state in a vacuum. Such a vacuum tube can generate a quantum effect as long as it is vacuum at a practical temperature (that is, practically non-scattering), and the quantum effect can be utilized.

Figure 5:
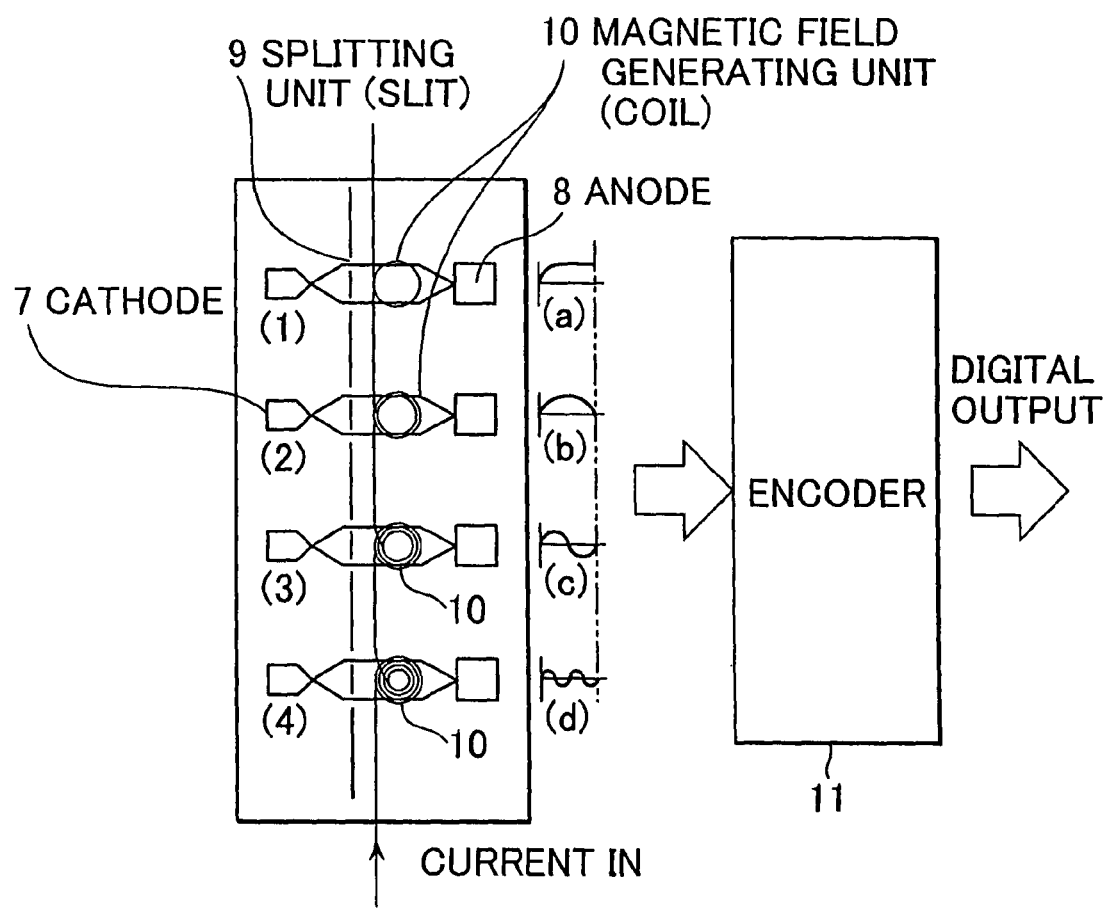
FIG. 5 is a structural view showing an example of an embodiment of this invention in which a Mach-Zehnder interference system is constructed by using a fine vacuum tube and an A/D converter is constructed.

FIG. 5 is a structural view showing an example of the embodiment of this invention in which an A/D converter is constructed by an AB (Aharonov-Bohm) effect element using a fine vacuum tube. In FIG. 5, 7 represents cathodes arranged in a vacuum. 8 represents anodes. Between these cathodes 7 and anodes 8, splitting units (slits) 9 for bisecting a flow of electrons emitted from the cathode 7 are arranged. Magnetic field generating units 10 are arranged between the splitting units 9 and the anodes 8. This magnetic field generating units 10 are formed in such a manner that the ratio of the intensity of their magnetic fields based on an input current is 1:2:4:8.

Outputs (a) to (d) of the anodes 8 in FIG. 5 show changes in output current in the case where an input current is supplied to the magnetic field generating units 10. The waveforms of individual vacuum elements (1) to (4) vary in cycles ⅛, ¼. ½ and 1 proportional to the reciprocal of the intensity of the magnetic field, where the horizontal axis represents the current flowing through the coils.

Figure 6:
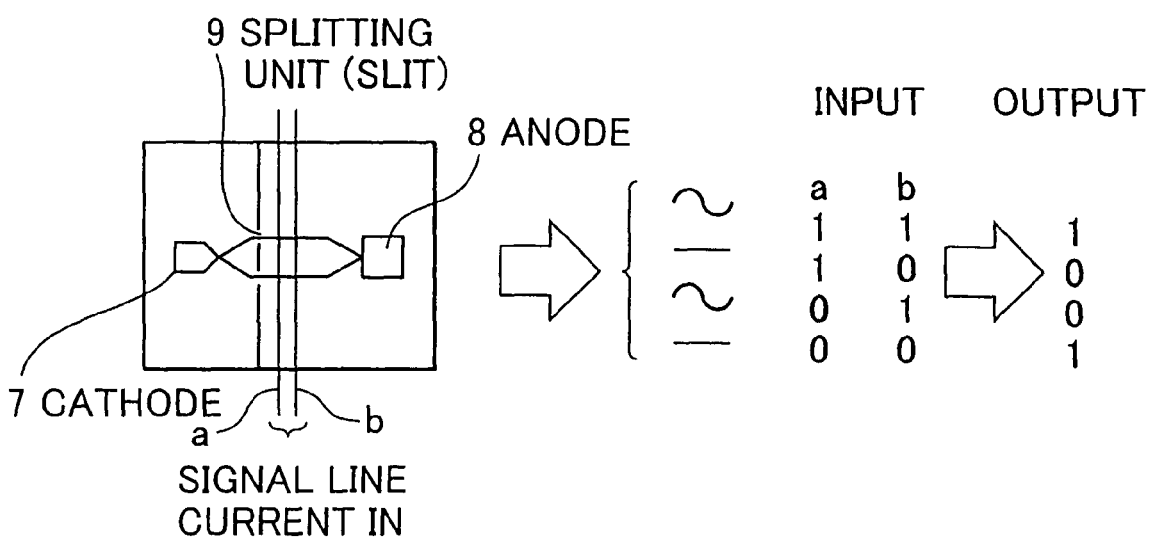
FIG. 6 is a structural view showing a structure in which a Mach-Zehnder interference system is constructed and exclusive NOR is formed.

FIG. 6 shows a structure in which a pair of cathode 7 and anode 8 is provided and in which two signal lines a, b are arranged instead of the coil 10 shown in FIG. 5, thus constructing a Mach-Zehnder interference system. As a current flowing through these signal lines is changed, exclusive NOR is formed.

That is, a current for generating a magnetic field (B) such that the phase difference between waves in the two paths is Π at the anode because of a magneto-optical effect is caused to flow. When this current flows through both of the signal lines a, b, the output is 1. When this current flows through one of the signal lines and no current flows through the other, the output is 0. When no current flows through the signal lines a, b, the output is 1.

By combining such logical circuits, it is possible to realize an advanced function-integrated apparatus for image processing or signal code conversion such as an MPEG-AVI (Moving Picture Experts Group to Audio Visual Interleave) encoder.

Generally, in the case of preparing an advanced function-integrated apparatus for image processing or signal code conversion such as an MPEG-AVI encoder, approximately 500 such logical circuits are necessary. In an integrated circuit made up of conventional logical circuits using transistors, 40 to 50 transistors per logical circuit are needed, and a total of 20,000 to 25,000 transistors are needed. However, if logical circuits as described above are used, one vacuum element suffices for one logic, and an integrated circuit can function with approximately 500 vacuum elements. (An image of such an integrated circuit is as shown in FIG. 3.)

Figure 7:
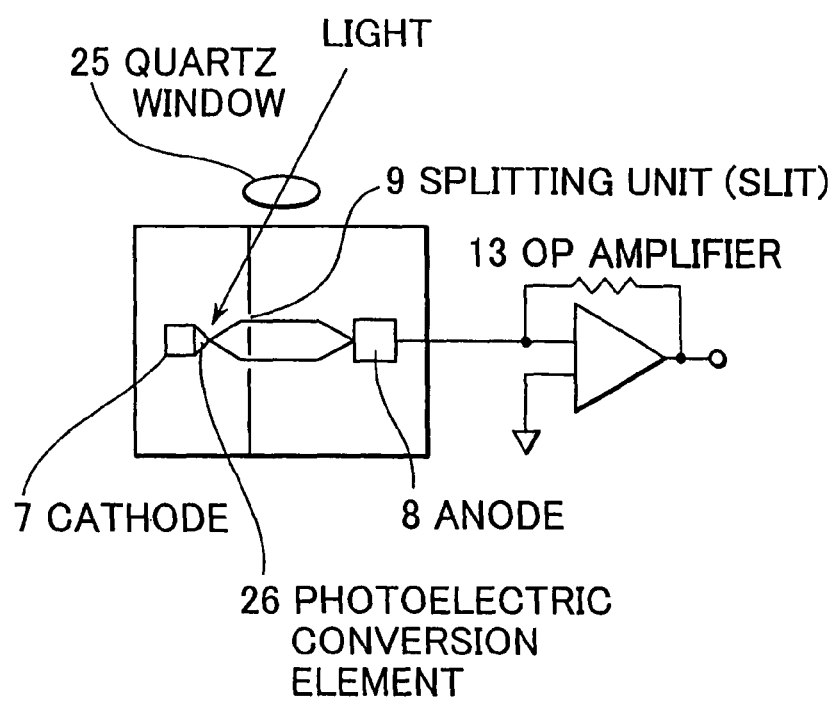
FIG. 7 is a structural view showing a structure in which a quartz window 25 is formed in a shell of a fine vacuum tube and is irradiated with light.

FIG. 7 shows a structure in which a surface of a cathode 7 is coated with a photoelectric conversion element 26 made of a member generating a photoelectric effect (for example, oxide of cesium having a low work function) and in which a quartz window 25 is formed in a shell of a fine vacuum tube so that light is case through this window.

With such a structure, high-speed photoelectric conversion is possible without using a photodiode.

Figure 8A:
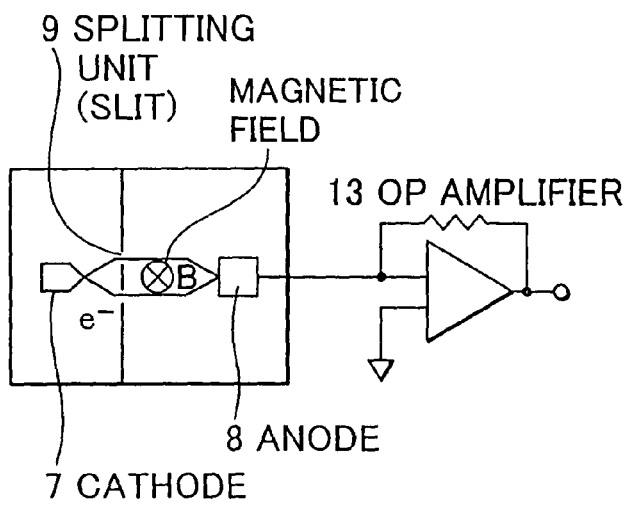
FIGS. 8A to 8C are views showing the structure of a magnetic field sensor using a Mach-Zehnder interference system.
Figure 8B:
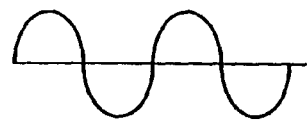

FIG. 8A shows a structure in which an OP amplifier 13 is connected to a stage subsequent to a slit 9, thus applying a magnetic field to a flow of electrons (e⁻). With such a structure, an output of the OP amplifier 13 is as shown in FIG. 8B.

Figure 8C:
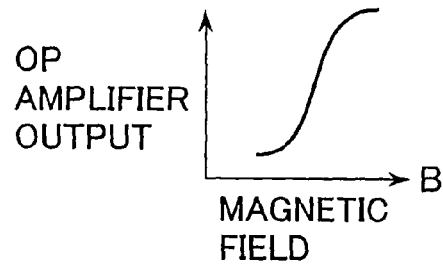

If this signal is caused to correspond to the intensity of a magnetic field (B) at approximately ¼ wavelength as shown in FIG. 8C, this can be used as a Mach-Zehnder-based magnetic field sensor.

Figure 9A:
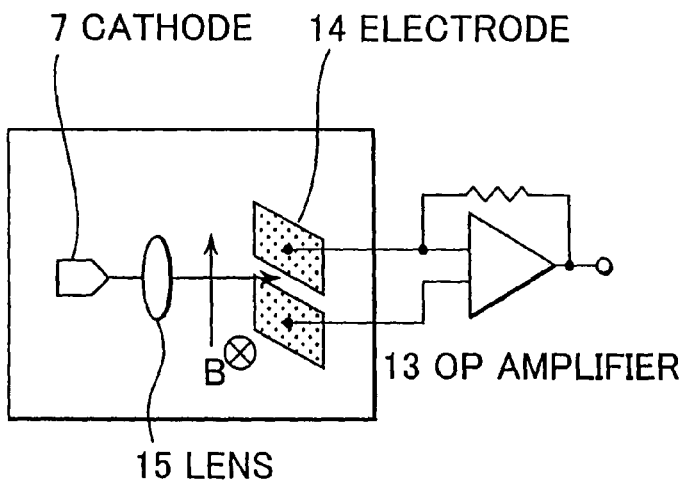
FIGS. 9A and 9B are views showing the structure of another magnetic field sensor using a Mach-Zehnder interference system.
Figure 9B:
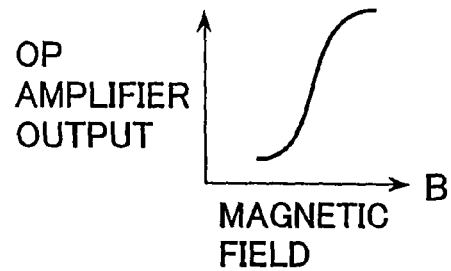

FIGS. 9A and 9B show a structure in which a lens 15 and two electrodes 14 are provided on a stage subsequent to a cathode so that electric signals from the individual electrodes are inputted to an OP amplifier 13. In this case, the two electrodes 14 are used as a slit, and a flow of electrons from the cathode 7 is narrowed by the lens 15 approximately to the width of the slit. Also in this case, if a magnetic field exists between the lens 15 and the electrodes, the direction of the flow of electrons is changed in accordance with the intensity of the magnetic field and a major part of a current flows to one of the electrodes. As a result, the output value of the OP amplifier 13 changes and the magnetic field (B) can be detected.

Figure 10:
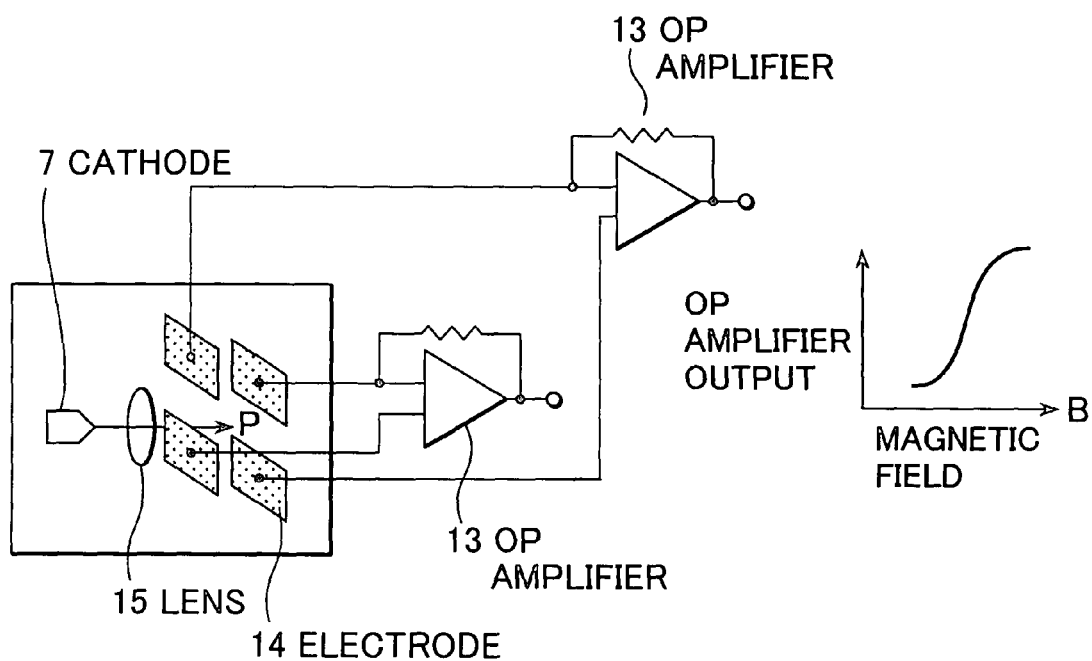
FIG. 10 is a view showing the structure of still another magnetic field sensor using a Mach-Zehnder interference system.

FIG. 10 shows a structure in which four electrodes are diagonally arranged so that a flow of electrons is concentrated at a center P of these electrodes.

With such a structure, it is possible to detect the direction of a magnetic field (B) on an XY plane by detecting the current difference between two electrodes respectively.

Figure 11A:
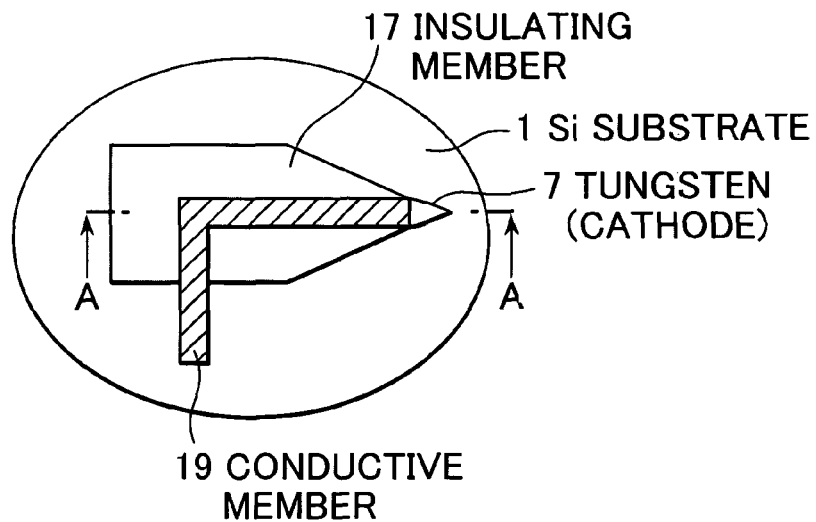
FIG. 11A is a plan view showing an example of a fine vacuum element used in this invention.
Figure 11B:
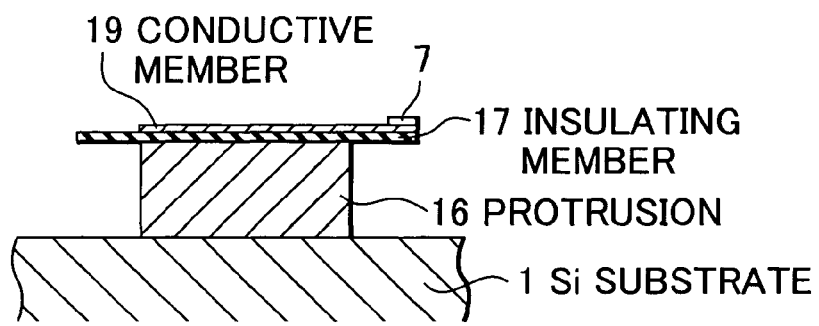
FIG. 11B is a sectional view along a line A-A in FIG. 11A.

FIG. 11A is a plan view showing an example of a fine vacuum tube used in this invention. FIG. 11B is a sectional view along a line A-A in FIG. 11A. In FIGS. 11A and 11B, a protrusion 16 made of, for example, SiO₂, and having a width of 2×2 μm and a height of approximately 1 μm, is formed on a substrate 1 of Si or InP. A plate-like insulating member 17 has, for example, a width of 3 μm, a length of 5 μm and a thickness of approximately 0.2 μm, and is formed in such a shape that its distal end is tapered. At the distal end part of this insulating member 17, a cathode 7 made of tungsten or LaB6 or carbon nanotube with a height of approximately 0.1 μm is formed, and a conductive member 19 is formed at one end of the cathode 7.

With such a structure, since the part including the cathode 7 is formed at the eaves hanging out from the protrusion 16, the earth capacity is reduced. Moreover, since the heating element (cathode) 7 has a small area, the heating concentrates at the limited part. As this heating element 7 is not in contact with the substrate 1, the heat is not absorbed by the substrate 1 and the calorific value increases. As a result, the current driving capability can be improved.

Generally, the conductive member 19 is made of an Al thin film. However, as the Al thin film has low thermal resistance, it may absorb the heat from the cathode 7.

Figure 12:
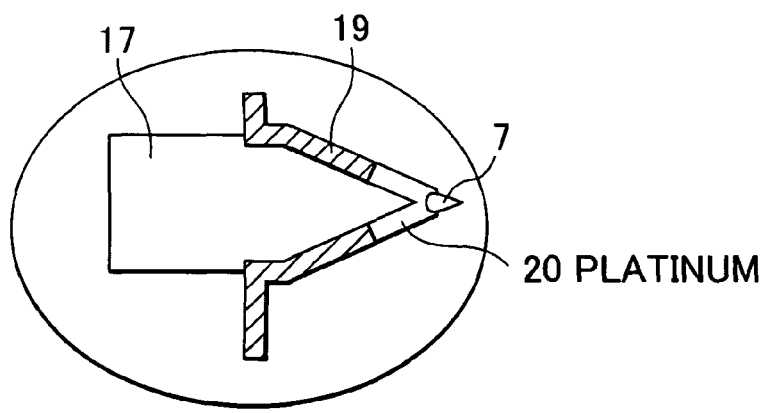
FIG. 12 is a plan view showing the structure of a cathode in which heat absorption is reduced.

FIG. 12 is a plan view showing the structure of a cathode in which its heat absorption is reduced. In this example, a platinum (Pt) thin film 20 having high thermal resistance is formed in predetermined area contacting a cathode 7, and an Al thin film 19 is formed in contact with one end of the Pt thin film 20. With such a structure, heat radiation from the cathode (heating element) 7 toward the conductive member 19 can be prevented.

Figure 13A:
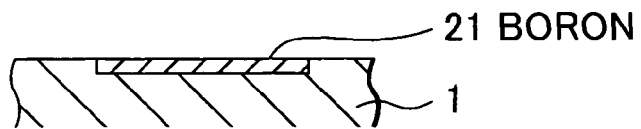
FIGS. 13A to 13C are sectional views showing a schematic preparation process of the fine vacuum element.
Figure 13B:
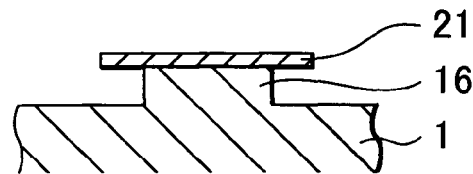
Figure 13C:
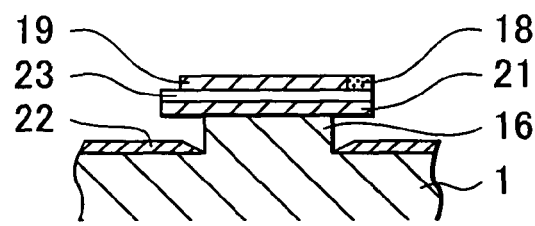

FIGS. 13A to 13C are sectional views showing a schematic preparation process of an example of the above-described thermionic emission element. The process steps will be described in order.

At a step of FIG. 13A, boron 21, which is an impurity, is injected or diffused at a high concentration (for example, approximately $1 \times 10^{20}/cm^3$) at a predetermined position on a Si substrate 1.

At a step of FIG. 13B, the substrate 1 is impregnated with a liquid of KOH or the like and wet etching is carried out. This leaves the impurity layer 21 and underetches the part below the impurity layer 21. A protrusion 16 is thus formed and the high-concentration layer 21 having a larger area than the protrusion 16 is formed on the protrusion 16.

Next, at step of FIG. 13C, thermal oxidation is carried out on the entire surface of the substrate 1 to form $SiO_2$ films 22, 23 as insulating layers on the substrate 1 including the high-concentration layer 21.

On the $SiO_2$ layer 23, a cathode (tungsten, Mo, LaB6, carbon nanotube) as shown in FIG. 10 and FIGS. 11A and 11B is formed and a conductive member 19 is formed.

Figure 14A:
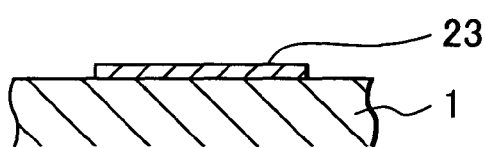
FIGS. 14A to 14C are sectional views showing another schematic preparation process of the fine vacuum element.
Figure 14B:
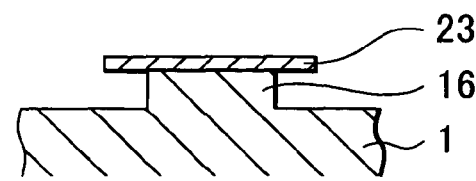
Figure 14C:
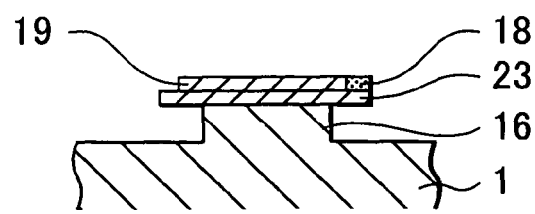

FIGS. 14A to 14C are sectional views showing a schematic preparation process of another example of the above-described thermionic emission element. The process steps will be described in order.

At step of FIG. 14A, a thermal oxidation layer ($SiO_2$) 23 as an insulating member with a thickness of approximately 1 μm is formed on the entire surface of a Si substrate 1 and is patterned into a desired shape.

At step of FIG. 14B, the substrate 1 is impregnated with a liquid of KOH or the like and wet etching is carried out. This underetches the part below the thermal oxidation layer 23. A protrusion 16 is thus formed and the insulating member 23 having a larger area than the protrusion 16 is formed on the protrusion 16.

Next, at step of FIG. 14C, on the insulating member 23, a cathode (tungsten) 18 as shown in FIG. 10 and FIGS. 11A and 11B is formed and a conductive member 19 is formed.

In the above description of this invention, only specific preferred examples are described for the purpose of explanation and illustration. Therefore, it should be understood by those skilled in the art that various changes and modifications can be made without departing from the scope of this invention. For example, while CMOS transistors or bipolar transistors are used as electronic elements in the embodiment, optical elements such as lasers and photodiodes may also be mounted.

It should be understood that the scope of this invention defined by the appended claims encompasses changes and modifications within that scope.

According to this invention, which is specifically described above using the embodiment, a fine vacuum tube element and other electric elements are integrated and formed on a semiconductor substrate so that signal are transmitted and received between the fine vacuum tube and the electronic elements. Therefore, an integrated circuit that achieves a high speed, advanced functions and reduction in the number of elements can be realized.

Moreover, by constructing a Mach-Zehnder interference system and providing magnetic field generating units, and by controlling the intensity of magnetic fields generated by the individual magnetic field generating units to a predetermined ratio, it is possible to realize a very high-speed A/D converter.

By constructing a Mach-Zehnder interference system and providing two signal lines, and performing on/off control of a current flowing through the signal lines, it is possible to form exclusive NOR. By combining devices of such a structure, it is possible to realize an advanced function-integrated apparatus for image processing and signal code conversion.

If a surface of a cathode is coated with a member generating a photoelectric effect and a quartz window is formed in a shell of a fine vacuum tube so as to cast light from this window, it is possible to realize high-speed photoelectric conversion without using a photodiode.

By constructing a Mach-Zehnder interference system, inputting electrons from a cathode to an OP amplifier and arranging the electrons in a magnetic field, it is possible to detect the intensity of the magnetic field.

Moreover, by constructing a Mach-Zehnder interference system, narrowing electrons from a cathode by a lens so that the electrons pass through a space between two or four electrodes, and detecting an output difference using an OP amplifier, it is possible to detect the direction and intensity of the magnetic field.

Furthermore, since a thermionic cathode is used as a cathode to improve the current driving capability, and LaB6 (lanthanum hexaboride) having a very high thermionic radiation efficiency is attached to the thermionic cathode, the current driving capability can be improved further.

Furthermore, although a magnetic field is used in order to obtain an interference of electron in the above description of the embodiments, an electric field also can be used. And also although tungsten and LaB6 (lanthanum hexaboride) are cited as the sample of a cathode, carbon nanotube also can be used.

What is claimed is:

1. An integrated circuit comprising:
   a fine vacuum tube element and other electronic elements integrated and formed on a substrate of a semiconductor,
   a magnetic field generating unit integrated and formed on the substrate of said semiconductor, and
   the fine vacuum tube element and the other electronic elements transmit signals to and from each other;
   wherein an interference system is constructed from said fine vacuum tube element.

2. The integrated circuit as claimed in claim 1, wherein when integrating the vacuum tube element with the other electronic elements, a quantum effect is realized in a room temperature environment by utilizing ballistic electrons (non-scattering electrons) traveling through the vacuum.

3. The integrated circuit as claimed in claim 1 or 2, wherein an interference system is constructed and weighting of the interference system is constituted for image processing and signal code conversion to realize an advanced function-integrated type.

4. The integrated circuit of claim 1, wherein the fine vacuum tube element and transistors are connected by wires.

5. The integrated circuit as claimed in claim 1 or 2, wherein a very high-speed light-receiving integrated circuit for optical communication is constructed by utilizing a very high-speed optical response characteristic of electron emission of the vacuum element.

6. The integrated circuit as claimed in claim 1 or 2, wherein a sensor such as a magnetic/electric field sensor is constructed by utilizing a quantum effect of ballistically traveling electrons.

7. The integrated circuit as claimed in claim 1 or 2, wherein a thermionic cathode is used as a cathode of the vacuum element.

8. The integrated circuit as claimed in claim 7, wherein LaB6 (lanthanum hexaboride) or carbon nanotube is attached to the thermionic cathode.

9. The integrated circuit according to claim 1, wherein the interference system is a Mach-Zehnder interferometer.

10. The integrated circuit according to claim 3, wherein the interference system is a Mach-Zehnder interferometer.

11. The integrated circuit device according to claim 1, wherein the other electronic elements are solid state devices.

12. The integrated circuit device according to claim 1, wherein the magnetic field generating unit is a coil.

13. The integrated circuit device according to claim 1, wherein the magnetic field generating unit is two current lines.

14. An integrated circuit comprising: a fine vacuum tube element and other electronic elements integrated and formed on a substrate of a semiconductor,
a quartz window in communication with said fine vacuum tube element,
a photoelectric conversion element in communication with said quartz window,
wherein said quartz window is configured to direct light to side photoelectric conversion element, and
the fine vacuum tube element and the other elements transmit signals to and from each other;
wherein an interference system is constructed from said fine vacuum tube element.

15. An integrated circuit comprising:
a fine vacuum tube element and other electronic elements integrated and formed on a substrate of a semiconductor,
a slit unit having a double slit, such that ballistic electrons pass through the double slit;
wherein said slit unit is contained within the fine vacuum tube element,
a magnetic field generating unit in communication with said fine vacuum tube element, and
the fine vacuum tube element and the other elements transmit signals to and from each other;
wherein an interference system is constructed from said fine vacuum tube element; and
wherein signals are transferred between the fine vacuum tube element and the electronic elements.

16. An integrated circuit comprising:
a fine vacuum tube element and transistors integrated and formed on a substrate of a semiconductor,
a magnetic field generating unit integrated and formed on the semiconductor substrate, and
the fine vacuum tube element and the other electronic elements transmit signals to and from each other;
wherein an interference system is constructed from said fine vacuum tube element.

* * * * *